United States Patent [19]

Goida et al.

[11] Patent Number: 5,084,753

[45] Date of Patent: Jan. 28, 1992

[54] PACKAGING FOR MULTIPLE CHIPS ON A SINGLE LEADFRAME

[75] Inventors: Thomas M. Goida, Derry, N.H.; Carl M. Goida, Jr., Topsfield, Mass.

[73] Assignee: Analog Devices, Inc., Norwood, Mass.

[21] Appl. No.: 300,328

[22] Filed: Jan. 23, 1989

[51] Int. Cl.⁵ ............................................. H01L 23/48
[52] U.S. Cl. ..................................... 357/70; 357/80; 357/65
[58] Field of Search ................... 357/72, 81, 70, 80, 357/75

[56] References Cited

U.S. PATENT DOCUMENTS

| | | | |
|---|---|---|---|
| 3,938,177 | 2/1976 | Hansen et al. | 357/80 |
| 3,978,516 | 8/1976 | Noe | 357/65 |
| 4,089,733 | 5/1978 | Zimmerman | 357/70 |
| 4,203,792 | 5/1980 | Thompson | 357/75 |
| 4,264,917 | 4/1981 | Ugon | 357/80 |
| 4,282,544 | 8/1981 | Nowak | 357/75 |
| 4,331,831 | 5/1982 | Ingram et al. | 357/81 |
| 4,450,461 | 5/1984 | Cook et al. | 357/75 |
| 4,532,538 | 7/1985 | Wurz | 357/75 |
| 4,794,431 | 12/1988 | Park | 357/70 |
| 4,878,106 | 10/1989 | Sachs | 357/75 |

FOREIGN PATENT DOCUMENTS

| | | | |
|---|---|---|---|
| 0161270 | 12/1979 | Japan | 357/70 |
| 0066655 | 4/1982 | Japan . | |
| 58-178544 | 10/1983 | Japan | 357/70 |
| 191457 | 11/1983 | Japan . | |
| 7159 | 1/1985 | Japan | 357/72 |
| 35655 | 2/1987 | Japan . | |
| 62-274645 | 11/1987 | Japan | 357/70 |
| 56950 | 3/1988 | Japan . | |
| 76741 | 3/1989 | Japan . | |
| 85/01835 | 4/1985 | PCT Int'l Appl. | 357/70 |
| 2196475 | 4/1988 | United Kingdom | 257/72 |

Primary Examiner—Andrew J. James
Assistant Examiner—Viet Q. Nguyen
Attorney, Agent, or Firm—Wolf, Greenfield & Sacks

[57] ABSTRACT

The foregoing objects are achieved in an assembly wherein the die attach paddle of a conventional leadframe is cut to form two electrically isolated die attach paddles and a dielectric tape is applied to one side of the two die attach paddles, spanning the space between them, providing physical support and substantially preventing cantilevered or twisting motion of the die attach paddles relative to the remainder of the leadframe assembly.

5 Claims, 3 Drawing Sheets

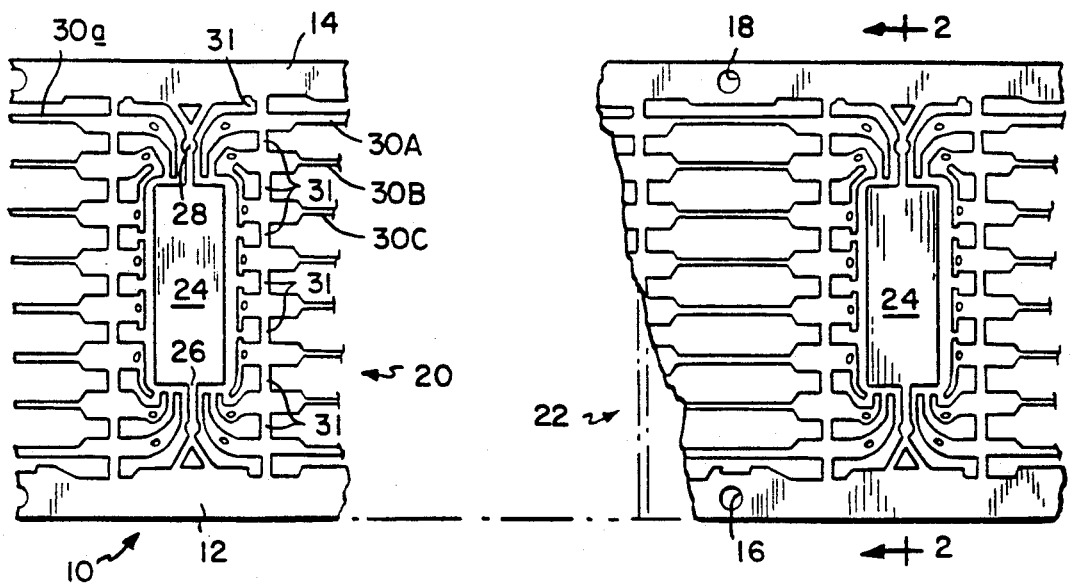
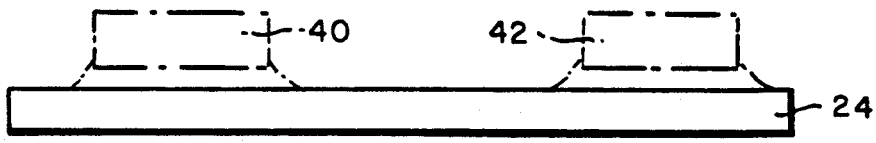
FIG. 1 PRIOR ART
FIG. 2 PRIOR ART
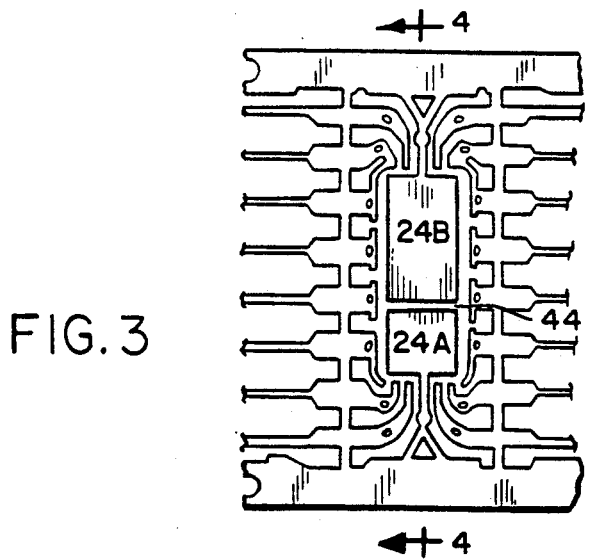
FIG. 3
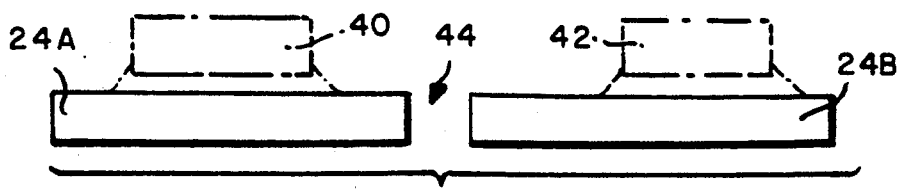
FIG. 4

PACKAGING FOR MULTIPLE CHIPS ON A SINGLE LEADFRAME

FIELD OF THE INVENTION

This invention relates to the field of integrated circuit packaging and, more specifically, to an arrangement which allows multiple semiconductor chips to be housed in a single package. The invention is most particularly suited for plastic packaging of integrated circuits.

BACKGROUND OF THE INVENTION

Semiconductor integrated circuits, or chips, are small (usually square or rectangular) pieces of semiconductor material (e.g., silicon or gallium arsenide) with dimensions typically on the order of 2-7 millimeters on a side. Semiconductor chips may contain complex circuitry formed of hundreds of thousands of individual electronic components. Naturally, to utilize such a chip, connections must be made between the chip itself and external circuitry. To facilitate use of the chip and the making of such connections, the chip is usually packaged in a housing equipped with a lead structure incorporating electrical leads, each of which is at one end electrically bonded to the chip and at its other end serves as a connection point to other circuits. Inside the package, these leads are connected to individual terminal sites, known as bonding pads, on the chip. A variety of conventional techniques are available to accomplish this bonding.

A leadframe typically carries only one chip. Thus, interconnections from chip to chip usually are made exteriorly to the chip package. While this provides flexibility in arranging interchip connections, there are situations in which such flexibility is unnecessary and adds to the cost of a product using the chips. Sometimes two chips are designed to be connected together in a particular fashion and advantages would accrue from connecting the chips within a single package, so that two chips could be sold as a single unit. Of course, there are instances when the circuitry on two smaller chips can be combined to be fabricated as a single chip in a single package. This is not possible, however, when the two constituent chips are manufactured using different process technologies.

To assemble two chips on a single leadframe, the chips must be placed side by side on the leadframe's die attach paddle. However, this approach cannot be used with chips which are backside biased, unless their biasing needs are the same under all conditions.

To solve this problem, some companies have removed the usual metal die attach paddle in the leadframe assembly and have replaced it with a dielectric substrate, onto which multiple chips may be mounted. The dielectric substrate is typically a ceramic or resin. The use of a dielectric is necessitated by the requirement to electrically isolate the substrates of the chips, so they may be separately backside biased. This solves the technical problem, but at considerable expense.

Accordingly, it is an object of the present invention to provide an inexpensive technique for assembling multiple integrated circuit chips on a single leadframe.

Another object of the invention is to provide a multiple chip mounting arrangement on a single leadframe which does not require removal of the metal die attach paddle of the leadframe or use of a dielectric substrate as a foundation for mounting the chips.

SUMMARY OF THE INVENTION

The foregoing objects are achieved in an assembly wherein the die attach paddle of a conventional leadframe is cut to form two electrically isolated die attach paddles and a dielectric tape is applied to one side of the two die attach paddles, spanning the space between them, providing physical support and substantially preventing cantilevered or twisting motion of the die attach paddles relative to the remainder of the leadframe assembly.

The die attach paddles may not be electrically isolated in the strictest sense of that term until the various leads of the leadframe are separated from the side rails. Hence, it should be understood that when the die attach paddles are referred to herein as being electrically isolated, that term is meant to indicate that the die attach paddles will be electrically isolated once the side rails are removed and all metal bridges between the leads are cut.

The invention will be more readily understood from the detailed description, which should be read in conjunction with the accompanying drawing. The detailed description is presented by way of example only, with the invention being defined only by the appended claims and equivalents thereto.

BRIEF DESCRIPTION OF THE DRAWING

In the drawing,

FIG. 1 is a top plan view of a typical prior art leadframe strip or a plurality of leadframe assemblies used for production of integrated circuits in plastic packages;

FIG. 2 is a cross sectional view of a single leadframe of FIG. 1, taken alone the lines 2—2 thereof, and showing in phantom two semiconductor chips p aced thereon;

FIG. 3 is a top plan view of a partially completed leadframe assembly according to the present invention;

FIG. 4 is a simplified cross-sectional view of the partially complete leadframe assembly of FIG. 3, taken alone the lines 4—4 thereof;

DETAILED DESCRIPTION

Figure 5:
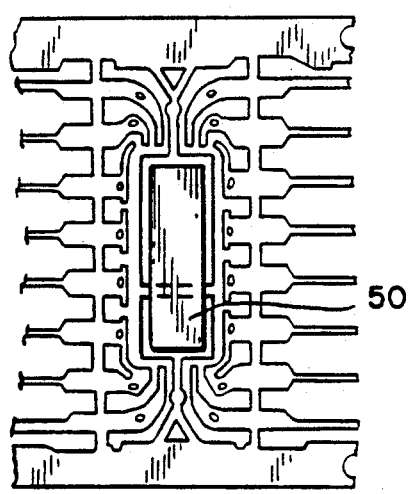
FIG. 5 is a bottom plan view of a completed leadframe assembly according to the present invention.

FIG. 1 shows a typical prior art leadframe strip 10, which is stamped from sheet metal. The leadframe strip 10 comprises a pair of side rails 12 and 14, each having sprocket holes, such as 16 and 18, at regularly spaced intervals. The sprocket holes cooperate during the chip assembly process with sprocket teeth in a mechanism for moving the leadframe strip through appropriate processing equipment. A leadframe strip generally has a large number of leadframe assemblies, such as the two assemblies 20 and 22, suspended between the side rails at regular intervals.

Referring to representative leadframe assembly 20, each leadframe assembly comprises a die attach paddle 24 supported from the side rails 12 and 14 by thin metal bridges 26 and 28, respectively. A plurality of connection pins or leads 30A, 30B . . . 30n are also suspended between the side rails via bridges 31 and are arrayed around the die attach paddle. These connection pins are later bonded to small wires which connect them to bonding pads, or terminals, on the semiconductor chip(s). Later in the assembly process, the bridges 26, 28 and 31 are severed, detaching the side rails 12 and 14 from the connection pin strips and electrically isolating each of the connection pins and the die attach paddle.

When two integrated circuit chips, such as chips 40 and 42, are mounted on opposite ends of die attach paddle 24, an arrangement such as that shown in FIG. 2 results. Since the die attach paddle is metal, chips 40 and 42 are, in such configuration, not electrically independent. If a bias voltage is applied to die attach paddle 24, it affects both chips 40 and 42. This, as noted above, is a situation that greatly restricts the flexibility of selecting two chips for assembly into the same package, since the two chips must be capable of operating with the substrate bias. Often, two chips which are to be closely interconnected must maintain independent biases.

According to the present invention, this problem is solved as shown in FIGS. 3-8. The first step in creating the assembly of the present invention is to provide a modified leadframe assembly, wherein the attach paddle is formed as or cut into two (or more) separate die attach paddles, as indicated, for example, by the paddles 24A and 24B of FIG. 3. A single die attach paddle 24 may be cut into two or more constituent and electrically isolated die attach paddles, or die attach paddles 24A and 24B can be manufactured separately from the beginning. Separate die attach paddles 24A and 24B can be the same size or different sizes. For purposes of generality, they are indicated in the drawings to be of different sizes. The resulting arrangement appears in a simplified cross sectional view in FIG. 4, wherein the space 44 between the two die attach paddle members 24A and 24B is more apparent. Again, chips 40 and 42 which are to be mounted on the respective die attach paddles are shown in phantom and in diagrammatic form only. This structure 10 allows separate backside biasing of the two chips, but it is impractical. The leadframe is formed from a very thin sheet metal stock, so the bridges 26 and 28 (not shown in FIG. 4, but identical to those shown in FIG. 1) are inadequate to rigidly support the die attached paddles 24A and 24B which, due to the gap 44, are now cantilevered from the siderails. The twisting and moving of the two die attached paddles in that situation is intolerable.

As a next step, therefore, in fabrication of the present invention, a strip of polyimide tape is applied, using a non conductive adhesive such as a silicone adhesive, to the reverse sides of the paddles 24A and 24B (i.e., the side which does not receive the chips). This is represented by the tape 50 in FIG. 5. A suitable material is Kapton ® tape manufactured by E. I. duPont de Nemours of Wilmington, Del.

Figure 6:
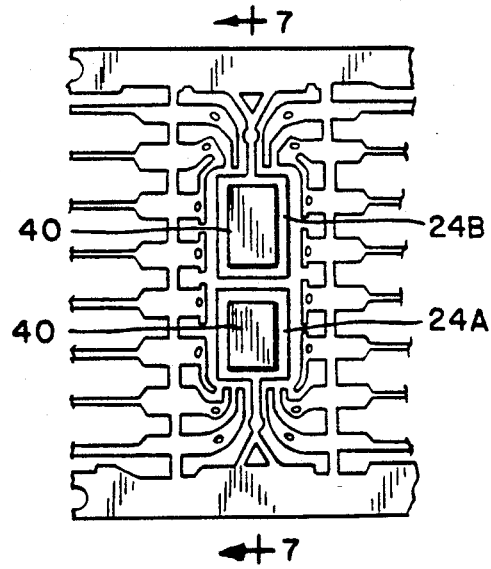
FIG. 6 is a top plan view of a completed leadframe assembly according to the present invention, with two chips mounted thereon.
Figure 7:
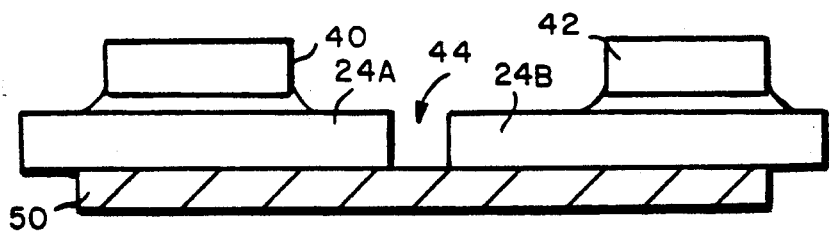
FIG. 7 is a simplified cross sectional view of the assembly of FIG. 6, taken alone the lines 7—7 thereof.

After the polyimide tape has been secured, providing structural stability to the assembly, the two chips are glued to the top surfaces of the respective die attach paddles 24A and 24B, as shown in FIG. 6. The resulting arrangement is shown in the simplified cross-section of FIG. 7.

Figure 8:
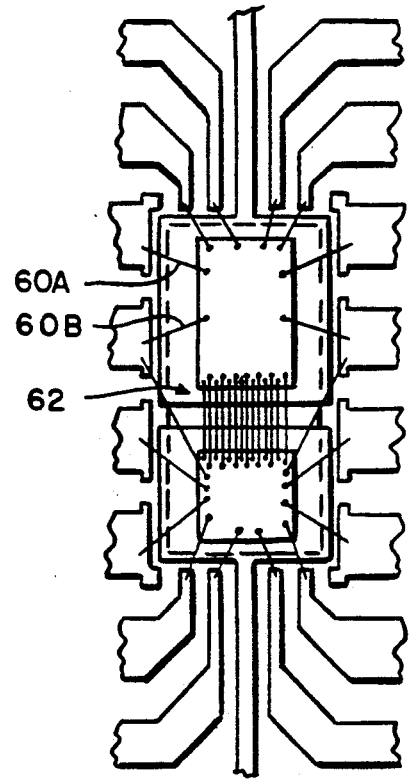
FIG. 8 is an expanded layout of the apparatus of FIG. 6, showing the internal electrical connections established between the two chips o the leadframe assembly.

Finally, the two chips 40 and 42 are wired to the connection pins, as shown in FIG. 8 by, for example, the wires 60A and 60B. They are also wired to each other by connecting appropriate conductors indicated generally at 62, between opposing bonding pads on the two chips. Lastly, the entire assembly is encapsulated in a plastic package.

The polyimide tape may be obtained with an already applied coating of a pressure sensitive adhesive, so that it can simply be pressed in place. Alternatively, the polyimide tape may be secured to the die attach paddles with a heat activated adhesive.

A prime benefit of this invention is its low cost. A total of 1-2¢ is added over the cost of the standard leadframe of the type shown in Fiq. 1. By contrast, the use of a ceramic substrate adds about 15-25¢ to fabrication costs, and the use of a resin substrate adds about 15 to fabrication cost.

Figure 9:
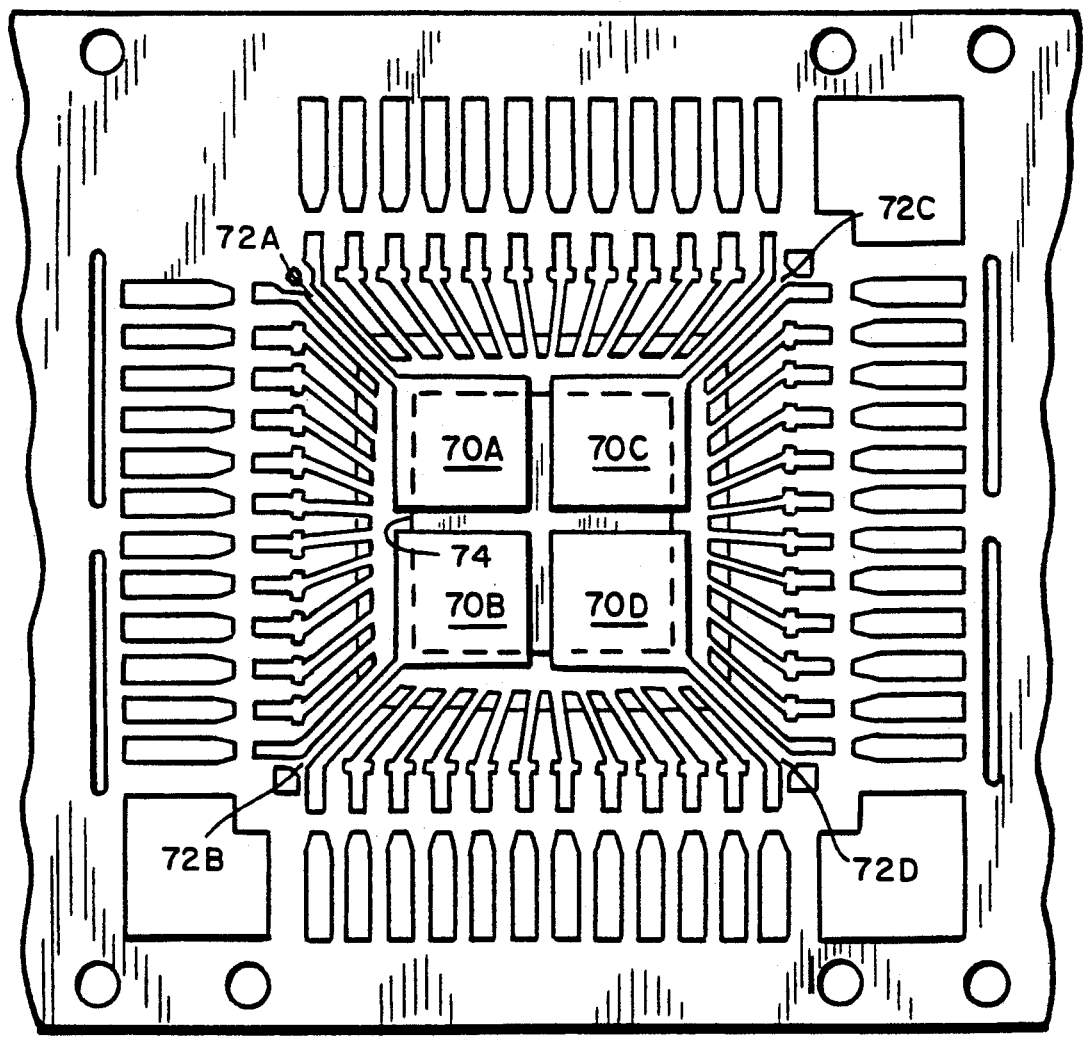
FIG. 9 is a top plan view of a leadframe assembly with four die attach paddles according to the present invention.

Up to four (or more) chips may be placed in a single package using this approach, using (for example) the arrangement shown in FIG. 9, where four separate die attach paddles 70A, 70B, 70C and 70D each have one bridge or tie bar (72A, 72B, 72C and 72D, respectively) connecting them to the side rail of the leadframe strip. A single strip of dielectric tape 74 may be applied across the backs of all the attach paddles. This can permit extremely complex functionality to be provided in a single package at low cost.

Having thus described the inventive concept and two embodiments which are shown by way of example only, it will be readily apparent that various alterations, modifications and improvements will occur to those skilled in the art. Such alterations, modifications and improvements are intended to be suggested herein, although not expressly stated. Accordingly, the invention is limited only by the following claims and equivalents thereto.

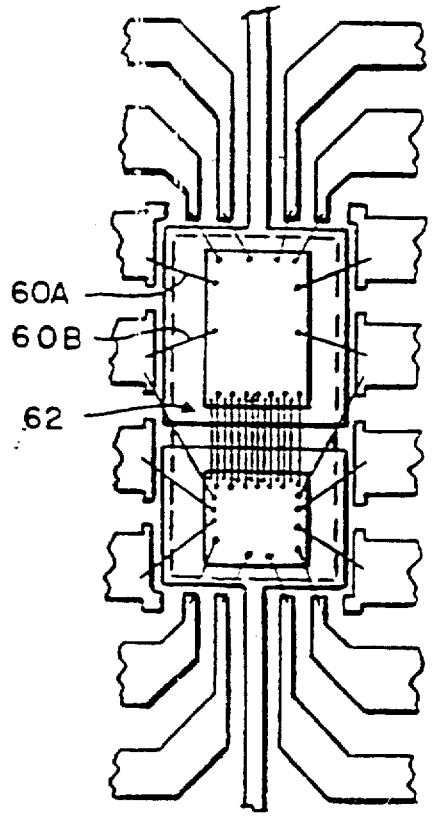

What is claimed is:

1. A lead frame assembly for receiving multiple integrated circuit chips on one side thereof, the integrated circuit chips each having active circuitry on one side and having a substrate contact on an opposite side, the lead frame assembly comprising:
   (a) at least one side rail;
   (b) a plurality of leads depending from at least one rail;
   (c) a first die attach paddle, connected to a first rail by a first lead, for receiving a first substrate bias voltage for application to the substrate contact of a first one of the chips;
   (d) a second die attach paddle connected to a rail by a second lead, for receiving a second substrate bias voltage for application to the substrate contact of a second one of the chips, such that the second die attach paddle and second chip substrate will be electrically isolated from the first die attach paddle and first chip substrate after the rails are cut away from the leads; and
   (e) a dielectric tape adhered to one side of the first and second die attach paddles to support the die attach paddles and limit relative motion therebetween, to permit direct chip-to-chip wiring connections, said side being the side of the paddles opposite the side which will receive the integrated circuit chips.

2. A leadframe assembly according to claim 1, said leadframe assembly further including a first side rail and a second side rail, the first die paddle being suspended from the second side rail, and wherein the dielectric tape is attached to one surface of the die attach paddles, whereby motion of the die attach paddles relative to each other is substantially prevented.

3. An integrated circuit package comprising:
(a) first and second integrated circuit chips, each including active circuitry on one side and including a substrate contact on an opposite side;
(b) a lead frame assembly including at least one side rail, a plurality of leads, a first die attach paddle connected to a first rail by a first lead, for receiving a first substrate bias voltage, and a second die attach paddle connected to a rail by a second lead, for a receiving a second substrate bias voltage, such that the second die attach paddle will be electrically isolated from the first die attach paddle, after the rails are cut away from the leads;
(c) the first and second integrated circuit chips being secured, respectively, to the first and second die attach paddles, such that the substrate contact of each makes electrical contact, respectively, with the first and second die attach paddles;
(d) a dielectric tape adhered to one side of the first and second die attach paddles to support the die attach paddles and limit relative motion therebetween, to permit direct electrical interconnections between circuitry of the first and second integrated circuits within the package, said side being the side of the paddles opposite the side which will receive the integrated circuit chips; and (e) electrical interconnections between circuitry of the first and second integrated circuits within the package.

4. An integrated circuit assembly comprising:
(a) first and second integrated circuit chips, each including active circuitry on one side and including a substrate contact on an opposite side;
(b) a leadframe assembly including a plurality of leads, a first die attach paddle connected to a first lead, for receiving a first substrate bias voltage, and a second die attach paddle connected to a second lead, for receiving a second substrate bias voltage, such that the second die attach paddle is electrically isolated from the first die attach paddle;
(c) the first and second integrated circuit chips being secured, respectively, to one side of the first and second die attach paddles, such that the substrate contact of each makes electrical contact, respectively, with the first and second die attach paddles;
(d) a dielectric tape adhered to a second side of the first and second die attach paddles to support the die attach paddles and limit relative motion therebetween, to permit direct electrical interconnections between circuitry of the first and second integrated circuits within the package.

5. An integrated circuit assembly as in claim 4, further comprising:
a bond wire connected directly between said first and second integrated circuit chips to effect an electrical connection between circuitry therein.

* * * * *

UNITED STATES PATENT AND TRADEMARK OFFICE
CERTIFICATE OF CORRECTION

PATENT NO. : 5,084,753
DATED : 1/28/92
INVENTOR(S) : Goida et al.

Page 1 of 2

It is certified that error appears in the above-identified patent and that said Letters Patent is hereby corrected as shown below:

The title page should be deleted to appear as per attached page.

Signed and Sealed this

Twenty-ninth Day of September, 1992

Attest:

DOUGLAS B. COMER

*Attesting Officer*   Acting Commissioner of Patents and Trademarks

United States Patent [19]
Goida et al.

[11] Patent Number: 5,084,753
[45] Date of Patent: Jan. 28, 1992

[54] PACKAGING FOR MULTIPLE CHIPS ON A SINGLE LEADFRAME

[75] Inventors: Thomas M. Goida, Derry, N.H.; Carl M. Roberts, Jr., Topsfield, Mass.

[73] Assignee: Analog Devices, Inc., Norwood, Mass.

[21] Appl. No.: 300,328

[22] Filed: Jan. 23, 1989

[51] Int. Cl.⁵ ............................................. H01L 23/48
[52] U.S. Cl. ................................... 357/70; 357/80; 357/65
[58] Field of Search .................. 357/72, 81, 70, 80, 357/75

[56] References Cited

U.S. PATENT DOCUMENTS

| | | | |
|---|---|---|---|
| 3,938,177 | 2/1976 | Hansen et al. | 357/80 |
| 3,978,516 | 8/1976 | Noe | 357/65 |
| 4,089,733 | 5/1978 | Zimmerman | 357/70 |
| 4,203,792 | 5/1980 | Thompson | 357/75 |
| 4,264,917 | 4/1981 | Ugon | 357/80 |
| 4,282,544 | 8/1981 | Nowak | 357/75 |
| 4,331,831 | 5/1982 | Ingram et al. | 357/81 |
| 4,450,461 | 5/1984 | Cook et al. | 357/75 |
| 4,532,538 | 7/1985 | Wurz | 357/75 |
| 4,794,431 | 12/1988 | Park | 357/70 |
| 4,878,106 | 10/1989 | Sachs | 357/75 |

FOREIGN PATENT DOCUMENTS

| | | | |
|---|---|---|---|
| 0161270 | 12/1979 | Japan | 357/70 |
| 0066655 | 4/1982 | Japan . | |
| 58-178544 | 10/1983 | Japan | 357/70 |
| 191457 | 11/1983 | Japan . | |
| 7159 | 1/1985 | Japan | 357/72 |
| 35655 | 2/1987 | Japan . | |
| 62-274645 | 11/1987 | Japan | 357/70 |
| 56950 | 3/1988 | Japan . | |
| 76741 | 3/1989 | Japan . | |
| 85/01835 | 4/1985 | PCT Int'l Appl. | 357/70 |
| 2196475 | 4/1988 | United Kingdom | 257/72 |

Primary Examiner—Andrew J. James
Assistant Examiner—Viet Q. Nguyen
Attorney, Agent, or Firm—Wolf, Greenfield & Sacks

[57] ABSTRACT

The foregoing objects are achieved in an assembly wherein the die attach paddle of a conventional leadframe is cut to form two electrically isolated die attach paddles and a dielectric tape is applied to one side of the two die attach paddles, spanning the space between them, providing physical support and substantially preventing cantilevered or twisting motion of the die attach paddles relative to the remainder of the leadframe assembly.

5 Claims, 3 Drawing Sheets